(12) United States Patent
Takayama et al.

(10) Patent No.: US 11,888,245 B2
(45) Date of Patent: Jan. 30, 2024

(54) FLEXIBLE SUBSTRATE AND ANTENNA MODULE INCLUDING FLEXIBLE SUBSTRATE

(71) Applicant: Murata Manufacturing Co., Ltd., Nagaokakyo (JP)

(72) Inventors: Keisei Takayama, Nagaokakyo (JP); Hirotsugu Mori, Nagaokakyo (JP); Yoshiki Yamada, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 209 days.

(21) Appl. No.: 17/560,252

(22) Filed: Dec. 23, 2021

(65) Prior Publication Data

US 2022/0115785 A1   Apr. 14, 2022

Related U.S. Application Data

(63) Continuation of application No. PCT/JP2020/022106, filed on Jun. 4, 2020.

(30) Foreign Application Priority Data

Jun. 26, 2019 (JP) .................... 2019-118424

(51) Int. Cl.
*H01Q 9/04* (2006.01)
*H01Q 1/12* (2006.01)
*H01Q 21/06* (2006.01)

(52) U.S. Cl.
CPC .............. *H01Q 9/045* (2013.01); *H01Q 1/12* (2013.01); *H01Q 21/065* (2013.01)

(58) Field of Classification Search
CPC ............ H01Q 9/045; H01Q 1/12; H01Q 1/36; H01Q 1/50; H01Q 21/08; H01Q 21/065; H01Q 21/24

See application file for complete search history.

(56) References Cited

U.S. PATENT DOCUMENTS

2019/0252771 A1*  8/2019  Yong ..................... H01Q 21/22

FOREIGN PATENT DOCUMENTS

| JP | 3-24702 U | 3/1991 |
| JP | 11-40906 A | 2/1999 |
| JP | 2004-88020 A | 3/2004 |

(Continued)

OTHER PUBLICATIONS

International Search Report and Written Opinion dated Sep. 8, 2020, received for PCT Application PCT/JP2020/022106, Filed on Jun. 4, 2020, 11 pages including English Translation.

(Continued)

*Primary Examiner* — Hoang V Nguyen
(74) *Attorney, Agent, or Firm* — XSENSUS LLP

(57) ABSTRACT

A flexible substrate includes a dielectric having flexibility, a first line, a second line, and ground electrode. The dielectric has a first surface and a second surface opposed to the first surface. The first line, the ground electrode, and the second line are laminated in this order in layers from the first surface to the second surface. When the flexible substrate is seen through from the thickness direction of the flexible substrate, the first line has a line-symmetrical portion that is line-symmetrical with respect to the second line with a virtual intermediate line (LM) serving as a symmetric line.

18 Claims, 14 Drawing Sheets

(56) References Cited

FOREIGN PATENT DOCUMENTS

| | | |
|---|---|---|
| JP | 2010-62544 A | 3/2010 |
| JP | 2013-149808 A | 8/2013 |
| JP | 2018-531386 A | 10/2018 |
| WO | 2015/186720 A1 | 12/2015 |
| WO | 2018/230475 A1 | 12/2018 |

OTHER PUBLICATIONS

Written Opinion of the International Searching Authority dated Sep. 8, 2020, received for PCT Application PCT/JP2020/022106, filed on Jun. 4, 2020, 5 pages. (Previously filed; submitting English translation only.).

* cited by examiner

FLEXIBLE SUBSTRATE AND ANTENNA MODULE INCLUDING FLEXIBLE SUBSTRATE

CROSS-REFERENCE TO RELATED APPLICATIONS

The present application is a continuation application of International Patent Application Ho. PCT/JP2020/022106, filed Jun. 4, 2020, which claims priority to Japanese Patent Application No. 2019-113424, filed Jun. 26, 2019, the entire contents of each of which being incorporated herein by reference.

TECHNICAL FIELD

The present disclosure relates to a technique for improving bendability of a flexible substrate.

BACKGROUND ART

Japanese Unexamined Patent Application Publication (Translation of PCT Application) No. 2018-531386 discloses a sensor including a first line formed on one surface of a substrate, a second line formed on the other surface of the substrate, and a ground electrode formed in an inner layer of the substrate. In this sensor, when the substrate is seen through from a thickness direction of the substrate, the first line and the second Line are disposed at positions overlapping each other.

CITATION LIST

Patent Document

Patent Document 1: Japanese Unexamined Patent Application Publication (Translation of PCT Application) No. 2018-531386

SUMMARY

Technical Problems

In the substrate disclosed in Japanese Unexamined Patent Application Publication No. 2016-213927, as described above, the first line and the second line are disposed at positions overlapping each other in the thickness direction of the substrate. However, as recognized by the present inventors, when such arrangement is applied to a flexible substrate having flexibility, a thickness of an overlapping portion of the first line and the second line is increased, and thus, there is a concern that the bendability of the flexible substrate is reduced.

The present disclosure has been made to solve such a problem, as well as other problems, and an aspect of the present disclosure is to, in a flexible substrate formed by laminating a first line, a ground electrode, and a second line in this order, easily make the first line and the second line have the same length while ensuring bendability of the flexible substrate.

Solution to Problems

A flexible substrate according to the present disclosure is a flexible substrate having a plate shape and includes a first surface, a second surface opposed to the first surface, a first line provided on the first surface or in a layer between the first surface and the second surface, a second line provided on the second surface or in a layer between the second surface and the first line, and a ground electrode provided in a layer between the first line and the second line so as to extend in the layer between the first surface and the second surface. The ground electrode forms a first radio frequency transmission line together with the first line and forms a second radio frequency transmission line together with the second line. Under a condition the flexible substrate is seen through from a thickness direction of the flexible substrate, the first line has a line-symmetrical portion that is line-symmetrical with respect to the second line with a virtual intermediate line between the first line and the second line serving as a symmetric line.

Under a condition the above-described flexible substrate is seen through from the thickness direction thereof, the first line and the second line have line-symmetrical portions that are line-symmetrical to each other with the virtual intermediate line serving as the symmetric line. With such arrangement, the first line and the second line can be prevented from overlapping each other in the thickness direction of the flexible substrate, so that the thickness of the flexible substrate can be reduced. Further, by arranging the first line and the second line in line symmetry, the first line and the second line can be easily made to have the same length. As a result, it is possible to easily make the first line and the second line have the same length while ensuring the bendability of the flexible substrate.

Advantageous Effects

According to the present disclosure, in the flexible substrate formed by laminating the first line, the ground electrode, and the second line in this order, it is possible to easily make the first line and the second line have the same length while ensuring bendability of the flexible substrate.

DESCRIPTION OF EMBODIMENTS

Figure 1:
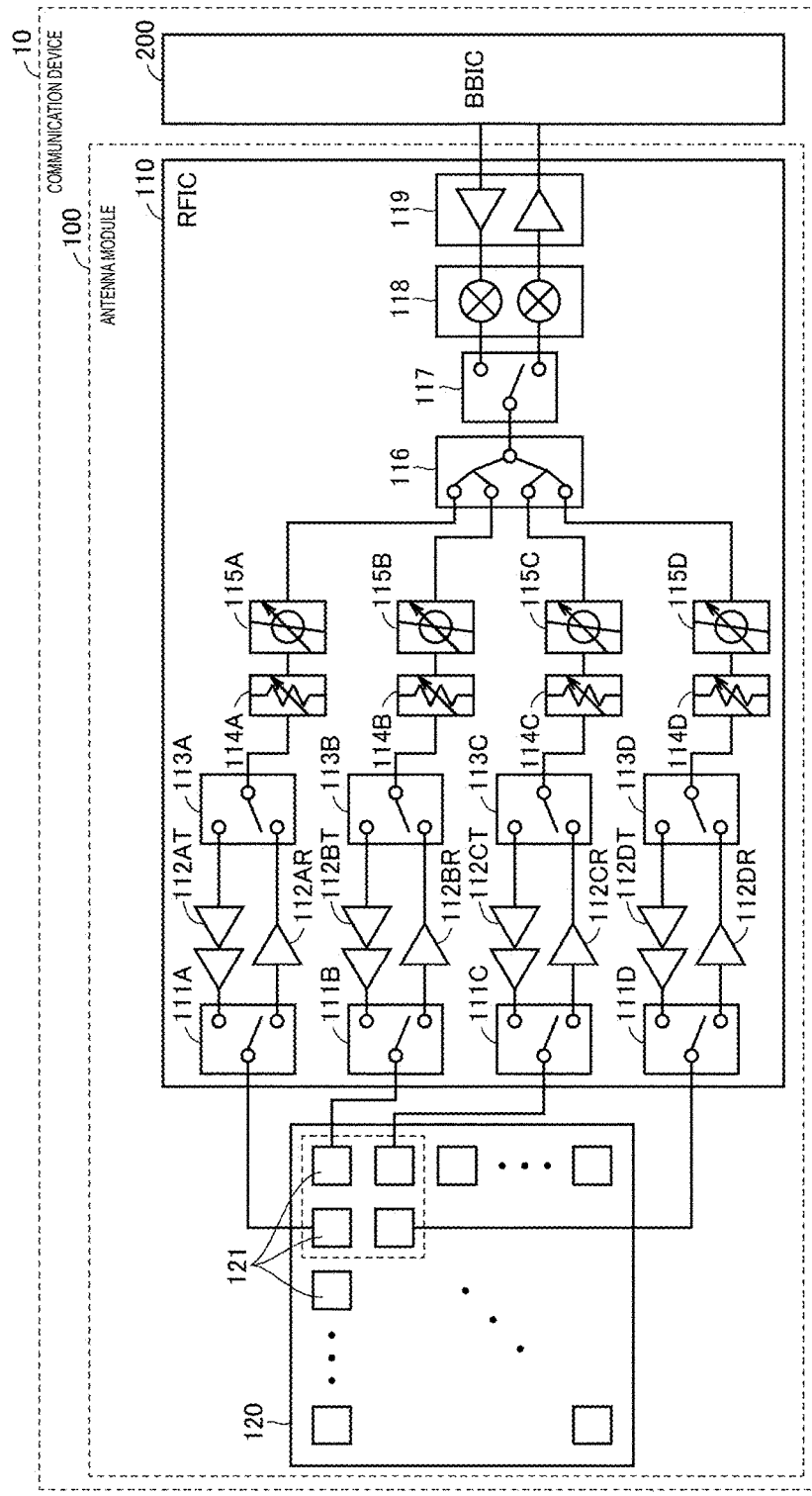
FIG. 1 is an example of a block diagram of a communication device.

Hereinafter, embodiments of the present disclosure will be described in detail with reference to the drawings. Note that in the drawings, the same or corresponding portions are denoted by the same reference signs, and description thereof will not be repeated.

(Basic Configuration of Communication Device)

FIG. 1 is an example of a block diagram of a communication device 10 to which an antenna module 100 including a flexible substrate according to Embodiment 1 is applied. The communication device 10 is, for example, a mobile terminal such as a mobile phone, a smartphone, or a tablet, or a personal computer having a communication function.

With reference to FIG. 1, the communication device 10 includes the antenna module 100 and a BBIC 200 constituting a base band signal processing circuit. The antenna module 100 includes an RFIC 110 that is an example of a feed circuit and an antenna device 120. The communication device 10 up-converts a signal transmitted from the BBIC 200 to the antenna module 100 into a radio frequency signal to radiate the signal from the antenna device 120, and down-converts a radio frequency signal received by the antenna device 120 to process the signal in the BBIC 200.

In FIG. 1, for ease of description, only configurations corresponding to four feeding elements 121 among the plurality of feeding elements 121 constituting the antenna device 120 are illustrated, and configurations corresponding to the other feeding elements 121 having similar configurations are omitted. In this context "feeding element" may be construed as the radiation element itself. However, "feeding element" may also include, as a separate component, the feed path the conveys RF to/from each radiating element with other circuitry such as filter 105. Note that although FIG. 1 illustrates an example in which the antenna device 120 is formed by using a plurality of feeding elements 121 arranged in a two-dimensional array, the number of feeding elements 121 is not necessarily plural and the antenna device 120 may be formed by using one feeding element 121. In the present embodiment, the feeding element 121 is a patch antenna (a type of radiation element that launches/receives RF waves) having a substantially square flat plate shape.

The RFIC 110 includes switches 111A to 111D, 113A to 113D, and 117, power amplifiers 112AT to 112DT, low-noise amplifiers 112AR to 112DR, attenuators 114A to 114D, phase shifters 115A to 115D, a signal multiplexer/demultiplexer 116, a mixer 118, and an amplifier circuit 119.

When a radio frequency signal is transmitted, the switches 111A to 111D and 113A to 113D are switched to sides of the power amplifiers 112AT to 112DT, and the switch 117 is connected to the transmission-side amplifier of the amplifier circuit 119. When a radio frequency signal is received, the switches 111A to 111D and 113A to 113D are switched to sides of the low-noise amplifiers 112AR to 112DR and the switch 117 is connected to the reception-side amplifier of the amplifier circuit 119.

A signal transmitted from the BBIC 200 is amplified by the amplifier circuit 119 and up-converted by the mixer 118. The transmission signal that is the up-converted radio frequency signal is demultiplexed into four signals by the signal multiplexer/demultiplexer 116, and the four signals pass through four signal paths to be fed to different feeding elements 121. At this time, the directivity of the antenna device 120 can be adjusted by individually adjusting the degree of phase shifting of the phase shifters 115A to 115D disposed in the respective signal paths.

Reception signals that are radio frequency signals received by the respective feeding elements 121 pass through four different signal paths, and are multiplexed by the signal multiplexer/demultiplexer 116. The multiplexed reception signal is down-converted by the mixer 113, amplified by the amplifier circuit 119, and transmitted to the BBIC 200.

The RFIC 110 is formed as, for example, a one chip integrated-circuit component including the above-described circuit configuration. Alternatively, devices (switches, power amplifiers, low-noise amplifiers, attenuators, and phase shifters) corresponding to the feeding elements 121 in the RFIC 110 may be formed as one chip integrated-circuit component for each corresponding feeding element 121.

(Arrangement of Antenna Module)

Figure 2:
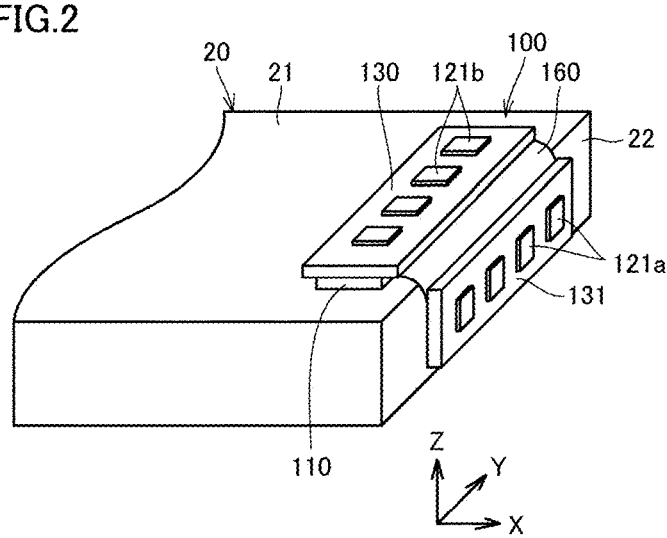
FIG. 2 is a diagram for explaining an arrangement of an antenna module.

FIG. 2 is a diagram for explaining arrangement of the antenna module 100 according to Embodiment 1. With reference to FIG. 2, the antenna module 100 is disposed on one main surface 21 of a mounting substrate 20 with an RFIC 110 interposed therebetween. Hereinafter, a normal direction of the main surface 21 of the mounting substrate 20 is also referred to as a "Z-axis direction", a normal direction of a side surface 22 of the mounting substrate 20 is also referred to as an "X-axis direction", and a direction perpendicular to the 2-axis direction and the X-axis direction is also referred to as a "Y-axis direction".

Dielectric substrates 130 and 131 are connected to the RFIC 110 by using a flexible substrate 160 having flexibility. Feeding elements 121a and 121b are respectively disposed on the dielectric substrates 130 and 131. The flexible substrate 160 is disposed on the surfaces of the dielectric substrates 130 and 131 opposite to the surfaces on which the feeding elements 121a and 121b are disposed, that is, on the surfaces facing the mounting substrate 20.

A frequency band of radio waves that can be radiated from the antenna module 100 is not particularly limited, but the antenna module 100 is applicable for radio waves in a millimeter wave band such as 23 GHz and/or 39 GHz, for example. Radio waves in frequency bands other than the above-described ones can however be applied, such as a band up to 300 GHz.

The dielectric substrate 130 extends along the main surface 21, and the feeding elements 121b are disposed so that radio waves are radiated in the normal direction (that is, the Z-axis direction) of the main surface 21.

The flexible substrate 160 is curved so as to face the side surface 22 from the main surface 21 of the mounting substrate 20, and the dielectric substrate 131 is disposed on a surface along the side surface 22. The feeding elements 121a are disposed on the dielectric substrate 131 so that radio waves are radiated in the normal direction of the side surface 22 (that is, the X-axis direction in FIG. 2). In this manner, by connecting the two dielectric substrates 130 and 131 by using the curved flexible substrate 160, radio waves can be radiated in two different directions.

The dielectric substrates 130 and 131 are formed of resin such as epoxy or polyimide, for example. Note that the dielectric substrates 130 and 131 may be formed by using liquid crystal polymer (LCP) or fluorine-based resin having a lower dielectric constant.

Figure 3:
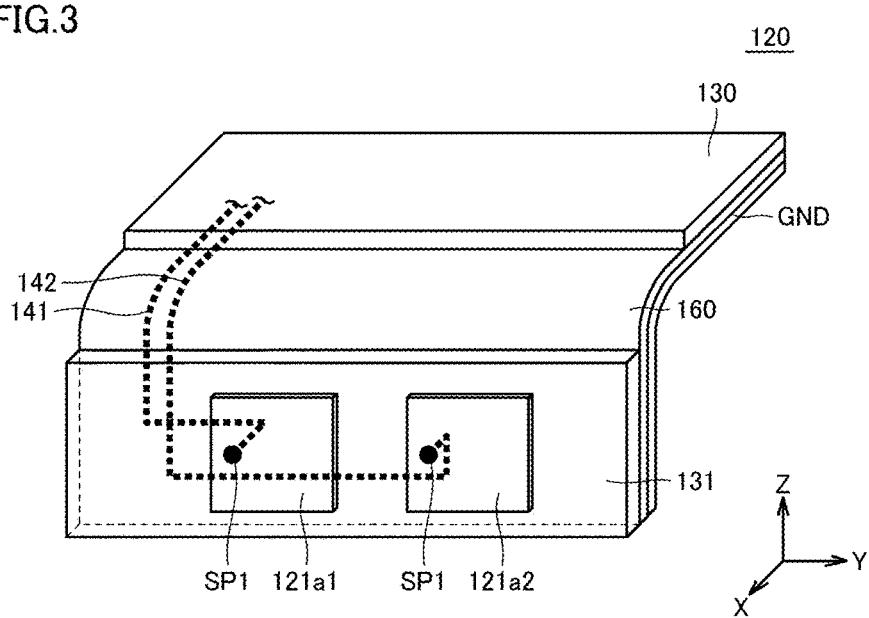
FIG. 3 is a perspective view of an antenna device.
Figure 4:
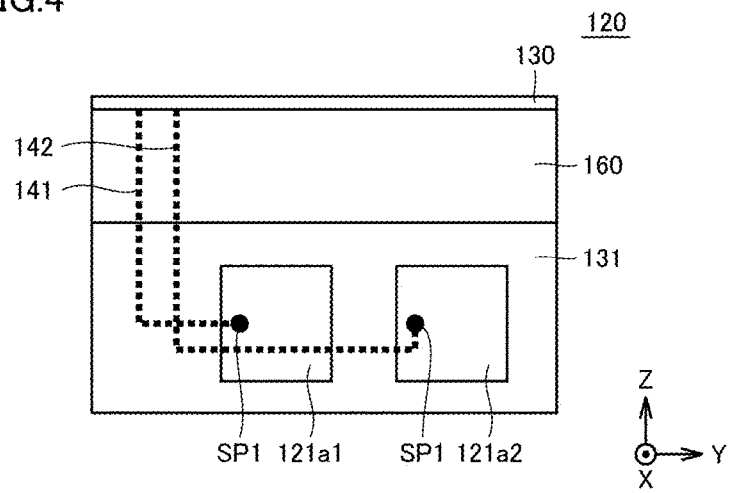
FIG. 4 is a diagram (part 1) of the antenna device viewed from the positive direction of an X-axis.
Figure 5:
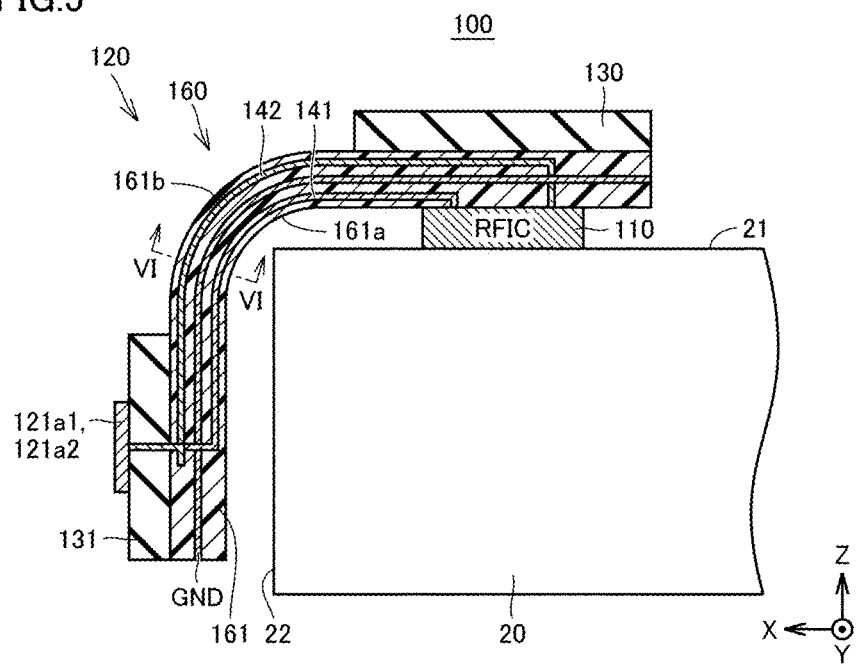
FIG. 5 is a cross-sectional view (part 1) of the antenna device viewed from the positive direction of a Y-axis.

Next, details of the antenna device 120 according to Embodiment 1 will be described with reference to FIG. 3 to FIG. 5. FIG. 3 is a perspective view of the antenna device 120. FIG. 4 is a diagram when the antenna device 120 is viewed from the positive direction of the X-axis in FIG. 3. FIG. 5 is a cross-sectional view of the antenna device 120 viewed from the positive direction of the Y-axis in FIG. 3.

In addition, in FIG. 3 to FIG. 5, for ease of description, a configuration in which two feeding elements 121a1 and 121a2 are disposed ort the dielectric substrate 131 will foe described as an example, but as described in FIG. 2, a configuration in which a plurality of feeding elements 121 are disposed in an array on the dielectric substrate 131 may be used. Further, in FIG. 3 to FIG. 5 and FIGS. 16, 17 to 21, 23, and 25 that will be described later, the feeding elements 121b disposed on the dielectric substrate 130 are omitted, but as described with reference to FIG. 2, a plurality of feeding elements 121b are disposed in an array on the dielectric substrate 130.

As described with reference to FIG. 2, the antenna device 120 is mounted on the mounting substrate 20 with the RFIC 110 interposed therebetween. The dielectric substrate 130 faces the main surface 21 of the mounting substrate 20, and the dielectric substrate 131 faces the side surface 22 of the mounting substrate 20. As described above, the flexible substrate 160 is disposed on the surfaces of the dielectric substrates 130 and 131 opposite to the surfaces on which the feeding elements 121 are disposed, that is, on the surfaces facing the mounting substrate 20.

Radio frequency signals are supplied to the feeding elements 121a1 and 121a2 disposed on the dielectric substrate 131 from the RFIC 110 through a first line 141 and a second line 142, respectively. In the example of FIG. 3, the first line 141 is connected to the feeding point SP1 provided at a position offset in the negative direction of the Y-axis from the surface center of the feeding element 121a1. As a result, a polarized wave having an excitation direction in the Y-axis direction is radiated from the feeding element 121a1 in the positive direction of the X-axis. Further, the second line 142 is connected to the feeding point SP1 provided at a position offset from the surface center of the feeding element 121a2 in the negative direction of the Y-axis. As a result, a polarized wave having an excitation direction in the Y-axis direction is radiated from the feeding element 121a2 in the positive direction of the X-axis, as with the feeding element 121a1. That, is, the antenna device 120 according to the present embodiment is a so-called single-polarization type antenna device that radiates a polarized radio wave having an excitation direction in the Y-axis direction from each feeding element 121. Mote that the feeding elements 121a1 and 121a2 may correspond to a "first element" and a "second element" of the present disclosure, respectively.

In addition, in the present embodiment, a case where the antenna device 120 is a so-called single-band type antenna device that radiates radio waves in one frequency band (for example, 28 GHz or 35 GHz) will be described.

As illustrated in FIG. 5, the flexible substrate 160 has a first surface 161a and a second surface 161b opposite to the first surface 161a (that is, being opposed to the first surface 161a). The flexible substrate 160 has a multilayer structure in which a first line 141, a ground electrode GND, and a second line 142 are laminated in this order at predetermined intervals from the first surface 161a to the second surface 161b. Portions of the flexible substrate 160 other than the first line 141, the ground electrode GND, and the second line 142 are formed of a dielectric 161. Note that FIG. 5 illustrates a state in which the flexible substrate 150 is bent with the first surface 161a facing inward.

The conductors constituting the first line 141, the ground electrode GND, the second line 142, and the like are formed of metal containing aluminum (Al), copper (Cu), gold (Au), silver (Ag), or an alloy thereof as a main component. Thus, the first line 141, the ground electrode GND, and the second line 142 do not have flexibility and are plastically deformed.

On the other hand, the dielectric 161 is formed of a material having flexibility (liquid crystal polymer, fluorine-based resin, or the like). Thus, the flexible substrate 160 has flexibility as a whole and can be bent at a desired angle.

The first line 141 is provided in a layer at the first surface 161a side from the ground electrode GND and connects the RFIC 110 and the feeding element 121a1. The first line 141 is formed as a signal line of a first microstrip line in the flexible substrate 160. Note that the first line 141 may be provided on the first surface 161a.

The second line 142 is provided in a layer at the second surface 161b side from the ground electrode GND and connects the RFIC 110 and the feeding element 121a2. The second line 142 is formed as a signal line of a second microstrip line in the flexible substrate 160. Note that the second line 142 may be provided on the second surface 161b.

The ground electrode GND extends in a planar manner along the first surface 161a and the second surface 161b in a layer between the first line 141 and the second line 142. The ground electrode GND is shared by the first line 141 (the first microstrip line) and the second line 142 (the second microstrip line). That is, the ground electrode GND forms the first microstrip line (first radio frequency transmission line) together with the first line 141, and forms the second microstrip line (second radio frequency transmission line) together with the second line 142. The radio frequency transmission line means a line having a distributed constant rather than a line having a lumped constant. Note that the first surface 161a, the second surface 161b, the first line 141, the second line 142, and the ground electrode GND may correspond to a "first surface" a "second surface", a "first line", a "second line", and a "ground electrode" of the present disclosure, respectively.

Figure 6:
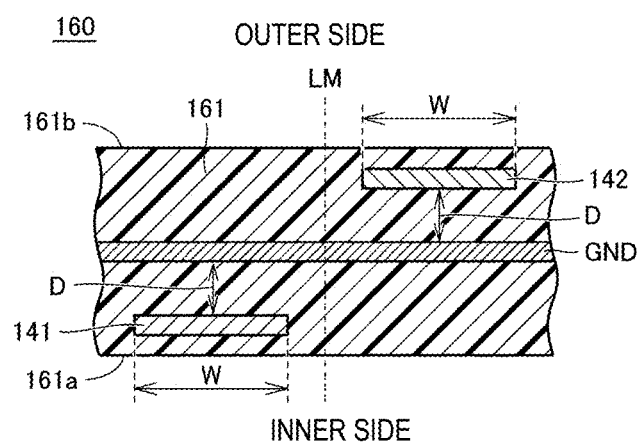
FIG. 6 is a partial cross-sectional view (part 1) of a flexible substrate.

FIG. 6 is a partial cross-sectional view of the flexible substrate 160 taken along the line VI-VI in FIG. 5. As illustrated in FIG. 6, the first line 141 is provided in a layer at the first surface 161a side (lower side in FIG. 6) from the ground electrode GND, and the second line 142 is provided in a layer at the second surface 161b side (upper side in FIG. 6) from the ground electrode GND. By interposing the ground electrode GND between the first line 141 and the second line 142 in this manner, isolation between the first line 141 and the second line 142 is ensured.

Further, the first line 141 and the second line 142 are disposed so as to be shifted from each other in a direction along the first surface 161a and the second surface 161b. Thus, one virtual intermediate line LM along the normal direction of the first surface 161a and the second surface 161b can be drawn between the first line 141 and the second line 142.

Note that, in the flexible substrate 160 according to the present embodiment, a thickness of the dielectric 161 at the first surface 161a side from the ground electrode GND is substantially the same as a thickness of the dielectric 161 at the second surface 161b side from the ground electrode GND. Further, a distance between the first line 141 and the ground electrode GND and a distance between the second line 142 and the ground electrode GND are substantially the same predetermined distance D. Additionally, a width of the first line 141 and a width of the ground electrode GND are substantially the same predetermined width W.

Figure 7:
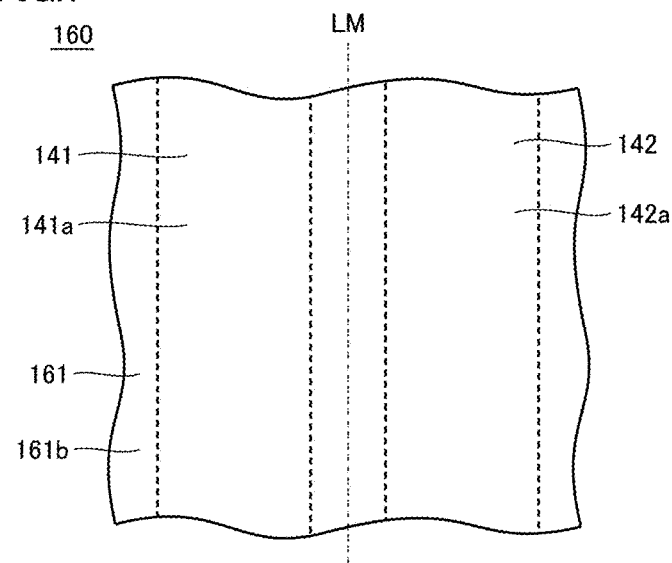
FIG. 7 is a partial perspective view (part 1) of the flexible substrate seen through from the thickness direction.

FIG. 7 is a partial perspective view when the flexible substrate 160 is seen through from the thickness direction of the flexible substrate 160 (that is, the normal direction of the first surface 161a or the second surface 161b). As used herein, the term "seen through" is meant to be construed as being viewed in plan with the first line 141 and second line 142 being visible through a transparent medium in which they are disposed. Of course, in reality, the medium may be opaque. As illustrated in FIG. 7, in the flexible substrate 160 according to the present embodiment, when the flexible substrate 160 is seen through from the thickness direction of the flexible substrate 160, the first line 141 and the second line 142 respectively have line-symmetrical portions 141a and 142a that are line-symmetrical to each other with respect to the virtual intermediate line LM between the first, line 141 and the second line 142 serving as a symmetric line.

With this arrangement, the first line 141 and the second line 142 do not overlap each other in the thickness direction of the flexible substrate 160. As a result, the thickness of the flexible substrate 160 can be reduced compared to a case where the first line 141 and the second line 142 overlap each other in the thickness direction of the flexible substrate 160. Thus, the bendability of the flexible substrate 160 can be ensured.

Furthermore, in the present embodiment, the first line 141 and the second line 142 respectively have the line-symmetrical portions 141a and 142a that are line-symmetrical to each other with respect to the virtual intermediate line LM serving as a symmetric line. Due to the arrangement in the line-symmetrical manner in this way, it is possible to easily make the first line 141 and the second line 142 have the same length.

In particular, in the present embodiment, the first line 141 and the second line 142 are arranged so as to be parallel to each other with respect to the virtual intermediate line LM serving as a symmetric line. As a result, compared to a case where the first line 141 and the second line 142 are not parallel to each other, the lengths of the first line 141 and the second line 142 can be shortened, and the first line 141 and the second line 142 can be disposed in a narrow region, and thus, it is possible to easily secure the degree of freedom of wiring.

As described above, in the flexible substrate 160 according to the present embodiment, the first line 141 and the second line 142 have the line-symmetrical portions 141a and 142a that are line-symmetrical to each other with respect to the virtual intermediate line LM serving as a symmetric line when the flexible substrate 160 is "seen through" from the thickness direction, presuming the flexible substrate was transparent. With such arrangement, the first line 141 and the second line 142 can be prevented from overlapping each other in the thickness direction of the flexible substrate 160, so that the thickness of the flexible substrate 160 can be reduced. Further, by arranging the first line 141 and the second line 142 in line symmetry, the first line 141 and the second line 142 can be easily made to have the same length. As a result, in the flexible substrate 160 formed by laminating the first line 141, the ground electrode GND, and the second line 142 in this order, it is possible to easily make the first, line 141 and the second line 142 have the same length while ensuring bendability of the flexible substrate 160.

<Modification>

In the flexible substrate 160 according to the above-described embodiment, when the flexible substrate 160 is seen through from the thickness direction, the first line 141 and the second line 142 are entirely parallel to each other.

However, the first line 141 and the second line 142 are not necessarily parallel to each other as a whole as long as the first line 141 and the second line 142 have portions that are line-symmetrical to each other with respect to the virtual intermediate line LM.

Figure 8:
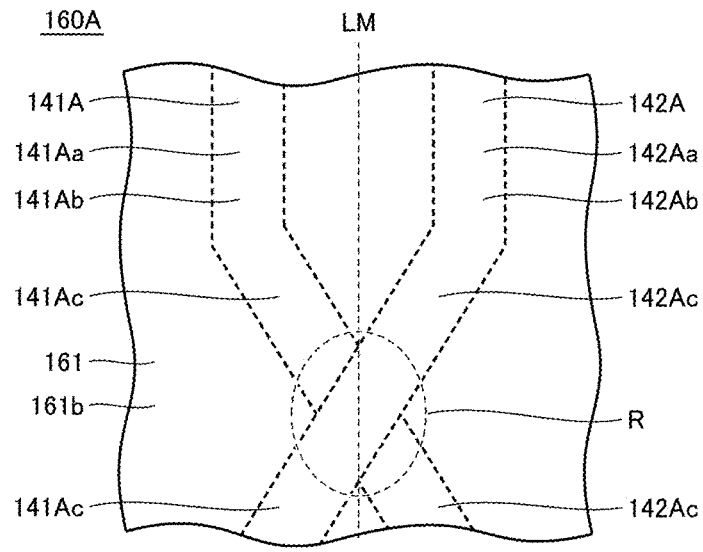
FIG. 8 is a partial perspective view (part 2) of the flexible substrate seen through from the thickness direction.

FIG. 8 is a partial perspective view of the flexible substrate 160A according to Modification 1 seen through from the thickness direction (normal direction of the second surface 161b). In the flexible substrate 160A, the first line 141 and the second line 142 of the flexible substrate 160 described above are changed to a first line 141A and a second line 142A, respectively.

As illustrated in FIG. 8, when the flexible substrate 160A is seen through from the thickness direction, the first line 141A and the second line 142A have line-symmetrical portions 141Aa and 142Aa that are line-symmetrical to each other with respect to the virtual intermediate line LM serving as a symmetric line. The line-symmetrical portions 141Aa and 142Aa include parallel portions 141Ab and 142Ab that are parallel to each other and inclined portions 141Ac and 142Ac that are linear but inclined to each other. Note that in the example illustrated in FIG. 8, the parallel portions 141Ab and 142Ab and the inclined portions 141Ac and 142Ac are illustrated as the line-symmetrical portions, but the line-symmetrical portions are not limited thereto. For example, the line-symmetrical portion may include a plurality of parallel portions having different intervals from each other, or may include only the inclined portions 141Ac and 142Ac.

Further, the flexible substrate 160A according to the present embodiment has an intersection portion R where the first line 141A and the second line 142A intersect each other when the flexible substrate 160A is seen through from the thickness direction. Even when such an intersection portion R is partially provided, the other portions are not overlapped in the thickness direction, so that the bendability of the flexible substrate 160A is hardly affected. As a result, the degree of freedom of wiring of the first line 141A and the second line 142A can be ensured without reducing the bendability of the flexible substrate 160A.

<Modification 2>

In the flexible substrate 160 according to the above-described embodiment, one layer of the ground electrode GND is provided in a layer between the first line 141 and the second line 142.

However, the number of ground electrodes provided in the layer between the first line 141 and the second line 142 is not necessarily limited to one, and may be equal to or larger than two.

Figure 9:
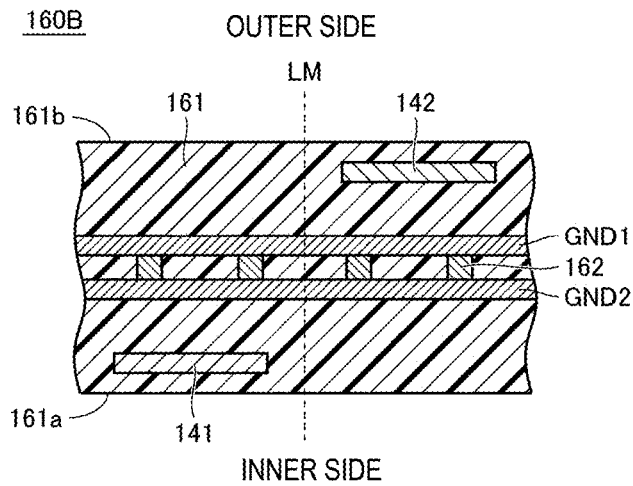
FIG. 9 is a partial cross-sectional view (part 2) of the flexible substrate.

FIG. 9 is a partial cross-sectional view of a flexible substrate 160B according to Modification 2. In the flexible substrate 160B, the ground electrode GND of the flexible substrate 160 described above is changed to the ground electrode GND1, the ground electrode GND2, and vias 162. Since the other configurations of the flexible substrate 160B are the same as those of flexible substrate 160 described above, detailed description thereof will not be repeated here.

The ground electrode GND1 and the ground electrode GND2 are aligned and arranged in a layer between the first line 141 and the second line 142 at a predetermined interval in the thickness direction of the flexible substrate 160B. The vias 162 electrically connect the first line 141 and the second line 142. Note that the ground electrode GND1, the ground electrode GND2, and the via 162 may correspond to a "first ground electrode", a "second ground electrode", and a "via" of the present disclosure, respectively.

In this way, by providing two or more ground electrodes in the layer between the first line 141 and the second line 142, the number of metallic layers that are more likely to be plastically deformed is increased compared to the case where one ground electrode is provided, and thus, it is possible to easily stabilize a bending angle when the flexible substrate 160B is bent.

<Modification 3>

In the flexible substrate 160 according to the above-described embodiment, the ground electrode GND to be shared by the first line 141 and the second line 142 is provided in the layer between the first line 141 and the second line 142.

However, in addition to the ground electrode GND to be shared by the first line 141 and the second line 142, a so-called coplanar transmission line may be formed by providing a ground electrode in the same layer as one of the first line 141 and the second line 142 without being shared by the other one.

Figure 10:
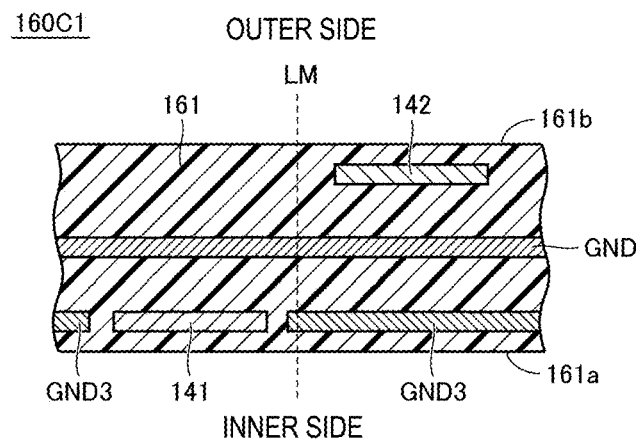
FIG. 10 is a partial cross-sectional view (part 3) of the flexible substrate.

FIG. 10 is a partial cross-sectional view of a flexible substrate 160C1 according to an example or Modification 3. The flexible substrate 160C1 is obtained by adding a ground electrode GND3 to the same layer as the first line 141 with respect to the flexible substrate 160 described above. Note that the ground electrode GND3 may correspond to a "third ground electrode" of the present disclosure.

In such a flexible substrate 160C1, for example, when the flexible substrate 160C1 is bent at a desired angle by being brought into contact with a guide or the like with the first surface 161a facing the inner side, the ground electrode GND3 that is easily plastically deformed is added to the inner side, and thus, the bending angle can be easily stabilized to the desired angle.

Figure 11:
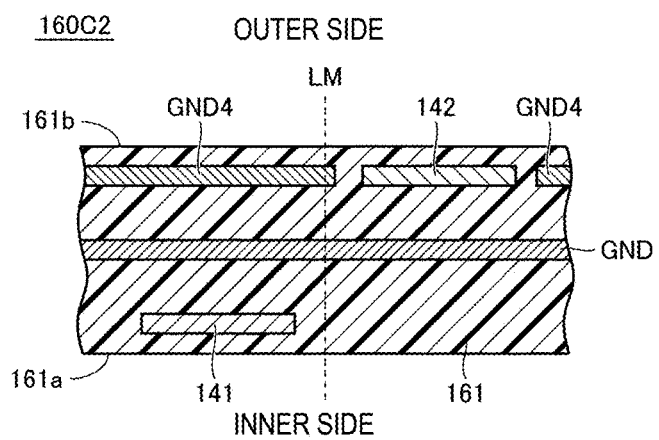
FIG. 11 is a partial cross-sectional view (part 4) of the flexible substrate.

FIG. 11 is a partial cross-sectional view of a flexible substrate 160C2 according to another example of Modification 3. The flexible substrate 160C2 is obtained by adding a ground electrode GND4 to the same layer as the second line 142 with respect to the flexible substrate 160 described above. Note that the ground electrode GND4 may correspond to a "fourth ground electrode" of the present disclosure.

In a case where the flexible substrate 160C2 is bent with the first surface 161a facing the inner side, at a portion where tensile stress is generated toward the outer side, when the tensile stress is concentrated on the second line 142 at the outer side, the second line 142 may be disconnected. However, in the flexible substrate 160C2, since the ground electrode GND4 is added to the same layer as the second line 142 at the outer side, the tensile stress is likely to be uniformly applied to the entire outer layer, and the tensile stress is unlikely to be concentrated on the second line 142. As a result, disconnection of the second line 142 at the outer side is less likely to occur.

<Modification 4>

In the flexible substrate 160 according to the above-described embodiment, the ground electrode GND is provided in a layer between the first line 141 and the second line 142.

However, in addition to the ground electrode GND between the first line 141 and the second line 142, ground electrodes GND5 and GND6 may be provided in a layer at the first surface 161a side from the first line 141 and a layer at the second surface 161b side from the second line 142, respectively, to form a so-called strip-line type transmission line.

Figure 12:
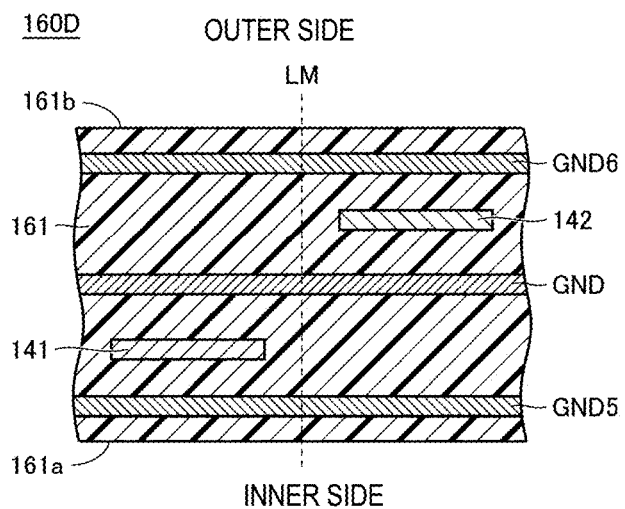
FIG. 12 is a partial cross-sectional view (part 5) of the flexible substrate.

FIG. 12 is a partial cross-sectional view of the flexible substrate 160D according to Modification 4. The flexible substrate 160D is obtained by adding the ground electrode GND5 to a layer at the first surface 161a side from the first line 141 and adding the ground electrode GND6 to a layer at the second surface 161b side from the second line 142 with respect to the above-described flexible substrate 160. Note that the ground electrodes GND5 and GND6 may correspond to a "fifth ground electrode" and a "sixth ground electrode" of the present disclosure, respectively.

In such a flexible substrate 160D, since the first line 141 and the second line 142 are provided between the ground electrode GND5 and the ground electrode GND6, it is possible to improve isolation at the inner side with respect, to the outer side of the flexible substrate 160D.

Note that it is not always necessary to provide both the ground electrode GND5 and the ground electrode GND6, and either of the ground electrode GND5 and the ground electrode GND6 may be provided.

<Modification 5>

In the present embodiment described above, since the antenna module 100 is a single-band type, a frequency of a signal to be transmitted by the first line 141 and a frequency of a signal to be transmitted by the second line 142 are the same.

However, when the antenna module 100 is a so-called dual-band type capable of radiating radio waves of two frequency bands, the first line 141 positioned at the inner side may be used for transmission of a signal having a lower frequency and the second line 142 positioned at the outer side may be used for transmission of a signal having a higher frequency in a state where the flexible substrate 160 is bent.

Figure 13:
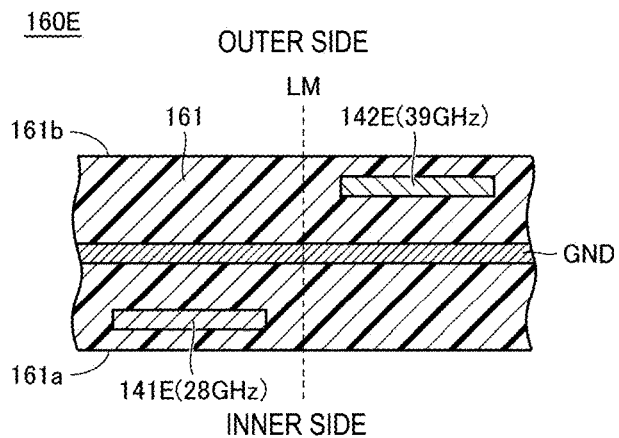
FIG. 13 is a partial cross-sectional view (part 6) of the flexible substrate.

FIG. 13 is a partial cross-sectional view of a flexible substrate 160E according to Modification 5. In the flexible substrate 160E, the first line 141 and the second line 142 of the flexible substrate 160 described above are changed to a first line 141E and a second line 142E, respectively. Since the other configurations of the flexible substrate 160E are the same as those of the flexible substrate 160 described above, detailed description thereof will not be repeated here.

In a portion where the flexible substrate 160E is bent with the first surface 161a facing the inner side, the first line 141E is positioned at the inner side than the second line 142E. In this case, compression stress is generated in the first line 141E at the inner side, and there is a concern that the surface of the first line 141E is wrinkled and roughened due to the influence of the compression stress. On the other hand, since tensile stress rather than compression stress is generated in the second line 142E at the outer side, the surface of the second line 142E is less likely to be wrinkled.

In general, the current density of an alternating current increases on the surface of a conductor due to a skin effect, and the current concentrates on the surface of the conductor as the frequency increases. Thus, the influence of the surface roughness on the transmission characteristics of a radio frequency signal increases as the frequency of the signal increases. In consideration of this point, in the flexible substrate 160E according to Modification 5, the first line 141E disposed at the inner side of a bent portion is used to transmit a signal having a lower frequency (for example, 28 GHz), and the second line 142E disposed at the outer side of the bent portion is used to transmit a signal having a higher frequency (for example, 39 GHz). By doing so, it is possible to minimize the influence on the transmission characteristics due to bending of the flexible substrate 160E.

<Modification 6>

In the flexible substrate 160 according to the above-described embodiment, the thickness of the dielectric 161 at the first surface 161a side from the ground electrode GND (hereinafter also referred to as an "inner thickness of the dielectric 161") and the thickness of the dielectric 161 at the second surface 161b side from the ground electrode GND (hereinafter also referred to as an "outer thickness of the dielectric 161") are substantially the same. Further, in the flexible substrate 160, the distance between the first line 141 and the ground electrode GND and the distance between the second line 142 and the ground electrode GND are substantially the same predetermined distance D. Further, the width of the first line 141 and the width of the ground electrode GND are substantially the same predetermined width W.

However, the inner and outer thicknesses of the dielectric 161 may be different. Further, the distance between the first line 141 and the ground electrode GND may be different from the distance between the second line 142 and the ground electrode GND. In addition, the width of the first line 141 may be different from the width of the ground electrode GND.

Figure 14:
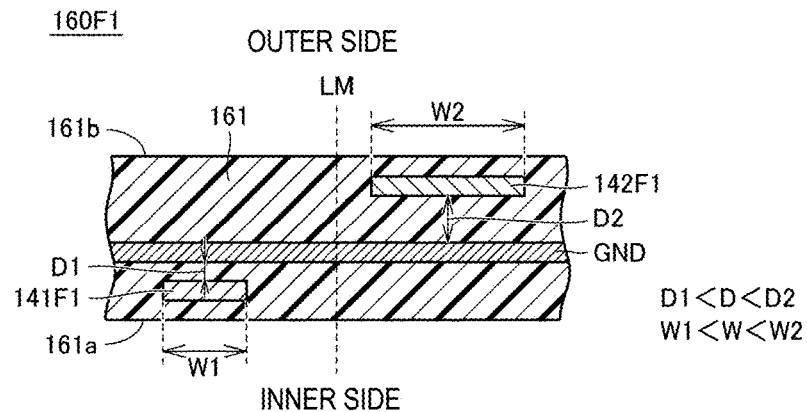
FIG. 14 is a partial cross-sectional view (part 7) of the flexible substrate.

FIG. 14 is a partial cross-sectional view of a flexible substrate 160F1 according to an example of Modification 6.

The flexible substrate 160F1 is different from the flexible substrate 160 described above in that the inner side of the dielectric 161 is thinner than the outer side thereof, and the first line 141 and the second line 142 of the flexible substrate 160 are changed to a first line 141F1 and a second line 142F1, respectively. Since the other configurations of the flexible substrate 160F1 are the same as those of the flexible substrate 160 described above, detailed description thereof will not be repeated here.

In view of the fact that the inner side of the dielectric 161 is thinner than the outer side thereof, a distance D1 between a first line 141F1 and the ground electrode GND is set to be shorter than the predetermined distance D, and a distance D2 between a second line 142F1 and the ground electrode GND is set to be longer than the predetermined length D. Further, a width W1 of the first line 141F1 is set to a value smaller than the predetermined width W, and a width W2 of the second line 142F2 is set to a value larger than the predetermined width W.

In the flexible substrate 160F1, since the distance D1 between the first line 141F1 and the ground electrode GND is shorter than the predetermined length D, when the width W1 of the first line 141F1 remains the predetermined width W, a capacitive reactance of the first line 141F1 becomes larger than a value when the distance D1 is the predetermined distance D. In view of this point, in the flexible substrate 160F1, the width W1 of the first line 141F1 is set to a value smaller than the predetermined width W. As a result, the increase in the capacitive reactance of the first line 141F1 caused by making the distance D1 shorter than the predetermined distance D can be canceled out by the decrease in the capacitive reactance caused by making the width W1 of the first line 141F1 smaller than the predetermined width W. As a result, an impedance of the first line 141F1 can be easily maintained.

In addition, in the flexible substrate 160F1, since the distance D2 between the second line 142F1 and the ground electrode GND is longer than the predetermined distance D, when the width W2 of the second line 142F1 remains the predetermined width W, a capacitive reactance of the second line 142F1 becomes smaller than the value when the distance D2 is the predetermined distance D. In view of this point, in the flexible substrate 160F1, the width W2 of the second line 142F1 is set to a value larger than the predetermined width W. As a result, the decrease in the capacitive reactance of the second line 142F1 caused by making the distance D2 longer than the predetermined distance D can be canceled out by the increase in the capacitive reactance caused by making the width W2 of the second line 142F1 larger than the predetermined width W. As a result, the impedance of the second line 142F1 can be easily maintained.

Further, in the flexible substrate 160F1, the second line 142F1 having the width W2 larger than the predetermined width W is disposed in a region at the outer side of the bent portion. As a result, the rigidity of the second line 142F1 at the outer side where tensile stress is generated when the flexible substrate 160F2 is bent is increased, and disconnection of the second line 142F1 is less likely to occur.

Figure 15:
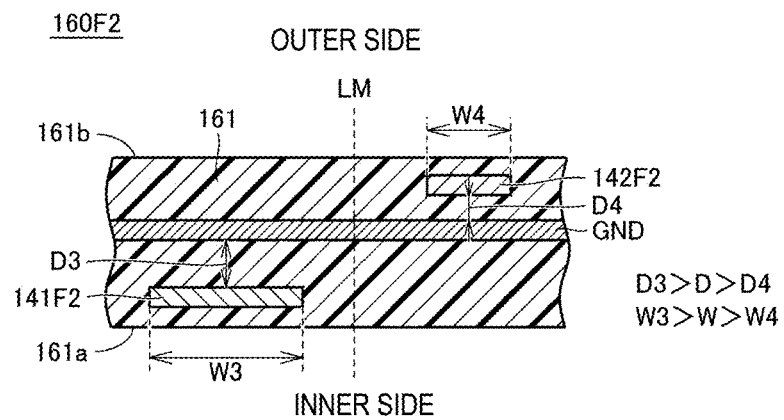
FIG. 15 is a partial cross-sectional view (part 8) of the flexible substrate.

FIG. 15 is a partial cross-sectional view of a flexible substrate 160F2 according to another example of Modification 6. The flexible substrate 160F2 is different from the above-described flexible substrate 160 in that the inner side of the dielectric 161 is thicker than the outer side thereof, and the first line 141 and the second line 142 of the above-described flexible substrate 160 are changed to a first line 141F2 and a second line 142F2, respectively. Since other configurations of the flexible substrate 160F2 are the same as those of the flexible substrate 160 described above, detailed description thereof will not be repeated here.

In view of the fact that the inner side of the dielectric 161 is thicker than the outer side thereof, the distance D3 between the first line 141F2 and the ground electrode GND is set to a value longer than the predetermined distance D, and the distance D4 between the second line 142F2 and the ground electrode GND is set to a value shorter than the predetermined distance D. Further, the width W3 of the first line 141F2 is set to a value larger than the predetermined width W, and the width W4 of the second line 142F2 is set to a value smaller than the predetermined width W. With this setting, the impedances of the first line 141F2 and the second line 142F2 can be easily maintained for the same reason as that of the flexible substrate 160F1 described above.

Further, in the flexible substrate 160F2, the first line 141F2 having the distance D3 from the ground electrode GND that is longer than the predetermined distance D is disposed in a region at the inner side of the bent portion. This makes it possible to keep the first line 141F2 at the inner side where compression stress is generated when the flexible substrate 160F2 is bent, away from the ground electrode GND. Thus, even when the first line 141F2 is displaced to the ground electrode GND due to the influence of compression stress generated when the flexible substrate 160F2 is bent with the first surface 161a facing the inner side, the first line 141F2 is less likely to abut on the ground electrode GND.

<Modification 7>

In the above-described embodiment, the antenna device 120 to which the flexible substrate 160 is applied includes the feeding element 121 (patch antenna) having a substantially square flat plate shape.

However, the antenna to which the flexible substrate 160 is applied is not limited to the patch antenna, and may be another type of antenna.

Figure 16:
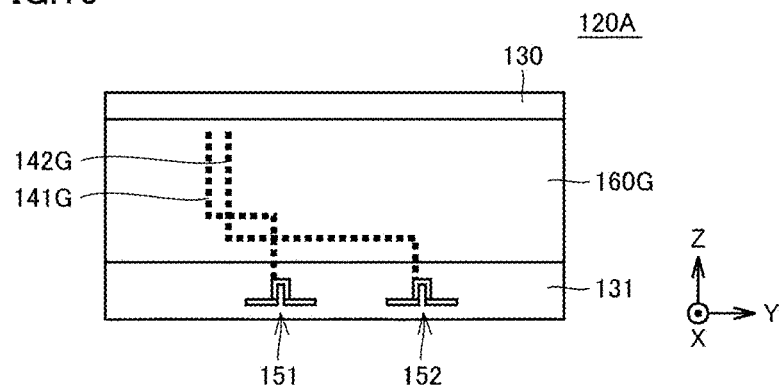
FIG. 16 is a diagram (part 2) of the antenna device viewed from the positive direction of the X-axis.

FIG. 16 is a diagram of the antenna device 120A according to Modification 7-1 viewed from the positive direction of the X-axis. The antenna device 120A is different from the above-described antenna device 120 illustrated in FIG. 4 in that the feeding elements 121a1 and 121a2 are respectively replaced with dipole antennas 151 and 152 and the flexible substrate 160 is replaced with a flexible substrate 160G.

In the flexible substrate 160G, the first line 141 and the second line 142 of the above-described flexible substrate 160 are changed to a first line 141G and a second line 142G, respectively. The first line 141G is obtained by changing the connection destination of the above-described first line 141 from the feeding element 121a1 to the dipole antenna 151. The second line 142G is obtained by changing the connection destination of the above-described second line 142 from the feeding element 121a2 to the dipole antenna 152. Since other configurations of the flexible substrate 160G are the same as those of the flexible substrate 160 described above, detailed description thereof will not be repeated here.

As described above, the flexible substrate 160G may be used for connection of a dipole antenna.

<Modification 7-2>

In the above-described embodiment, the flexible substrate 160 is applied to the antenna device 120 of a so-called single-polarization type.

However, the antenna to which the flexible substrate 160 is applied is not limited to the single-polarization type antenna device, and may be a so-called dual-polarization type antenna capable of radiating two radio waves having different polarization directions from each other.

Figure 17:
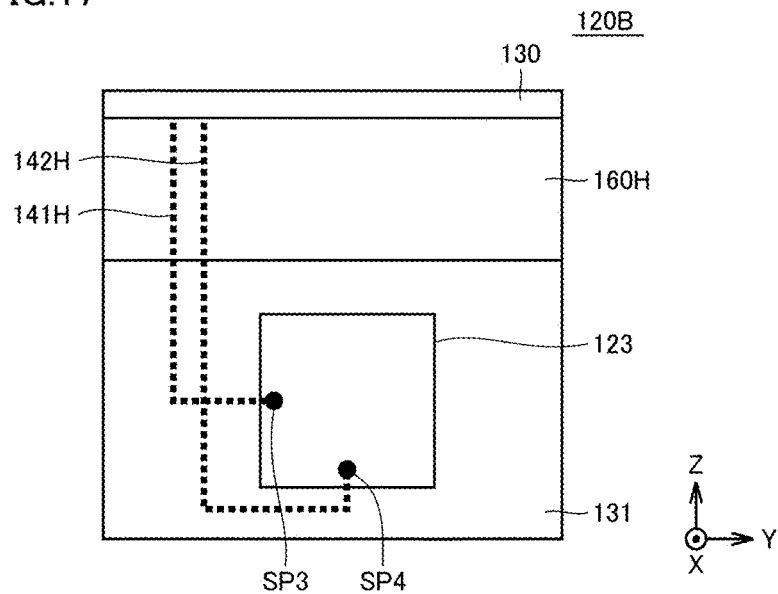
FIG. 17 is a diagram (part 3) of the antenna device viewed from the positive direction of the X-axis.

FIG. 17 is a diagram illustrating the antenna device 120B according to Modification 7-2 viewed from the positive direction of the X-axis. The antenna device 120B is different from the antenna device 120 described above in that the feeding element 121 is changed to a feeding element 123 and the flexible substrate 160 is changed to a flexible substrate 160H.

The feeding element 123 includes a feeding point SP3 provided at a position offset from the surface center of the feeding element 123 in the negative direction of the Y-axis and a feeding point SP4 provided at a position offset from the surface center of the feeding element 123 in the negative direction of the Z-axis.

In the flexible substrate 160H, the first line 141 and the second line 142 of the above-described flexible substrate 160 are changed to a first line 141H and a second line 142H, respectively. The first line 141H is obtained by changing the connection destination of the above-described first line 141 from the feeding point SP1 of the feeding element 121a1 to the feeding point SP3 of the feeding element 123. The second line 142H is obtained by changing the connection destination of the above-described second line 142 from the feeding point SP1 of the feeding element 121a2 to the feeding point SP4 of the feeding element 123. Since other configurations of the flexible substrate 160H are the same as those of the flexible substrate 160 described above, detailed description thereof will not be repeated here.

When a radio frequency signal from the RFIC 110 is supplied to the feeding point SP3 through the first line 141H, a radio wave having a polarization direction in the Y-axis direction (hereinafter also referred to as a "Y-polarized wave") is radiated from the feeding element 123. When a radio frequency signal from the RFIC 110 is supplied to the feeding point SP4 through the second line 142H, a radio wave having a polarization direction in the 2-axis direction (hereinafter also referred to as a "2-polarized wave") is radiated from the feeding element 123. Note that the Y-axis direction and the feeding point SP3 may correspond to a "first direction" and a "first feeding point" of the present disclosure, respectively. In addition, the 2-axis direction and the feeding point SP4 may correspond to a "second direction" and a "second feeding point" of the present disclosure, respectively.

In this way, the flexible substrate 160H may be a dual-polarization type antenna. In the flexible substrate 160H, the ground electrode GND is disposed between the first line 141H and the second line 142H. Thus, it is possible to easily ensure isolation between polarized waves having different polarization directions (between the Y-polarized wave and the 2-polarized wave).

<Modification 7-3>

In the embodiment described above, the flexible substrate 160 is applied to the antenna device 120 of a so-called single-band type.

However, the antenna to which the flexible substrate 160 is applied is not limited to the single-band type antenna device, and may be a so-called dual-band type antenna device.

Figure 18:
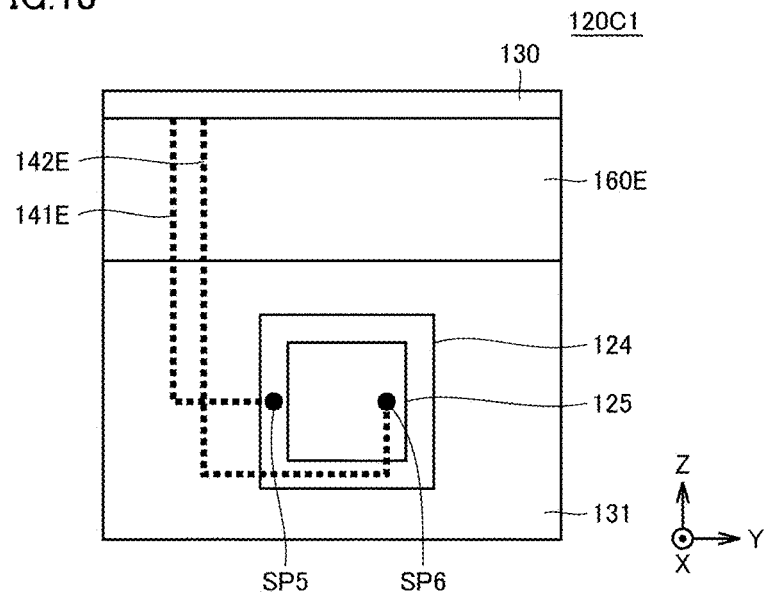
FIG. 18 is a diagram (part 4) or the antenna device viewed from the positive direction of the X-axis.

FIG. 18 is a diagram illustrating an antenna device 120C1 according to an example of Modification 7-3 viewed from the positive direction of the X-axis. The antenna device 120C1 is different from the antenna device 120 illustrated in FIG. 4 in that the feeding elements 121a1 and 121a2 are replaced with feeding elements 124 and 125 and the flexible substrate 160 is replaced with the flexible substrate 160E. The flexible substrate 160E is the same as the flexible substrate 160E described in Modification 5 described above (see FIG. 13).

The feeding element 124 and the feeding element 125 are disposed at positions overlapping each other when viewed from the X-axis direction, at a predetermined interval in the X-axis direction. The feeding element 124 includes a feeding point SP5 provided at a position offset, from the surface center of the feeding element 124 in the negative direction of the Y-axis. The feeding element 125 includes a feeding point SP6 provided at a position offset from the surface center of the feeding element 125 in the positive direction of the Y-axis.

The first line 141E is connected to the feeding point SP5 of the feeding element 124. A radio frequency signal for the first frequency (for example, 23 GHz) from the RFIC 110 is supplied to the feeding point SP5 of the feeding element 124 through the first Line 141E, so that a Y-polarized wave of the first frequency is radiated from the feeding element 124.

The second line 142E is connected to the feeding point SP6 of the feeding element 125. A radio frequency signal for the second frequency (for example, 39 GHz) being higher than the first frequency from the RFIC 110 is supplied to the feeding point SP6 of the feeding element 125 through the second line 142E, and thus, a Y-polarized wave of the second frequency is radiated from the feeding element 125. In view of the fact that the feeding element 125 radiates a radio wave of the second frequency being higher than the first frequency, a length of one side of the feeding element 125 is set to a value shorter than a length of one side of the feeding element 124. Note that the feeding elements 124 and 125 may respectively correspond to a "first element" and a "second element" of the present disclosure.

In the example illustrated in FIG. 18, both of the feeding elements 124 and 125 radiate Y-polarized waves, but the feeding elements 124 and 125 may radiate radio waves having polarization directions different from each other. For example, the feeding point SP6 of the feeding element 125 may be provided at a position offset not in the Y-axis direction but in the Z-axis direction so that a Z-polarized wave is radiated from the feeding element 125.

Figure 19:
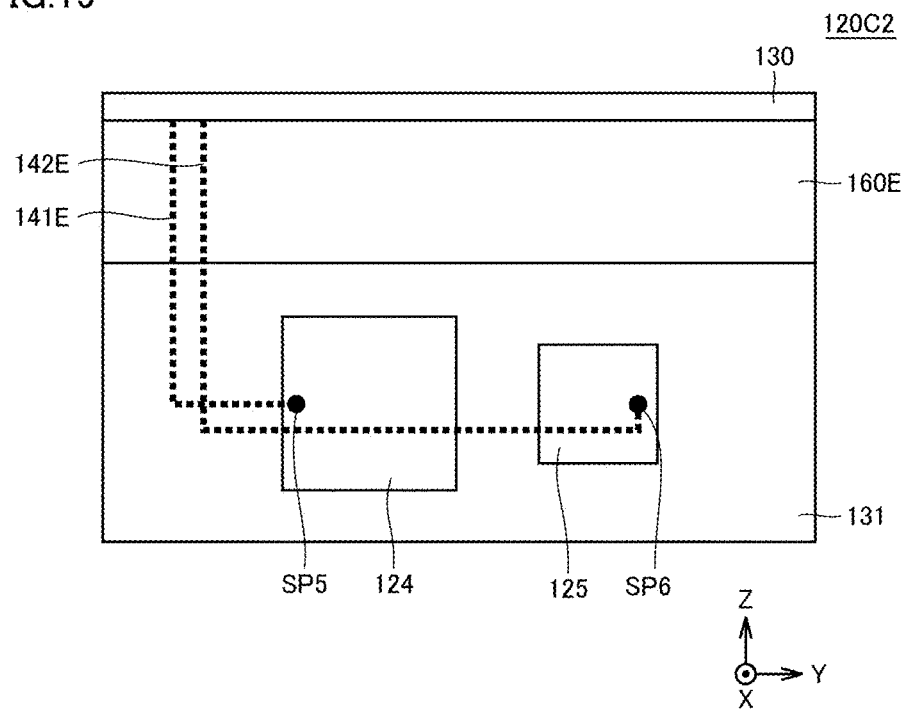
FIG. 19 is a diagram (part 5) of the antenna device viewed from the positive direction of the X-axis.

FIG. 19 is a diagram illustrating an antenna device 120C2 according to another example of Modification 7-3 when the antenna device 120C2 is viewed from the positive direction of the X-axis. The antenna device 120C2 is different from the antenna device 120C1 illustrated in FIG. 18 in that the feeding element 124 and the feeding element 125 are aligned and arranged in the Y-axis direction at a predetermined interval. The feeding element 124 and the feeding element 125 may be provided in the same layer in the X-axis direction or may be provided in different layers.

Figure 20:
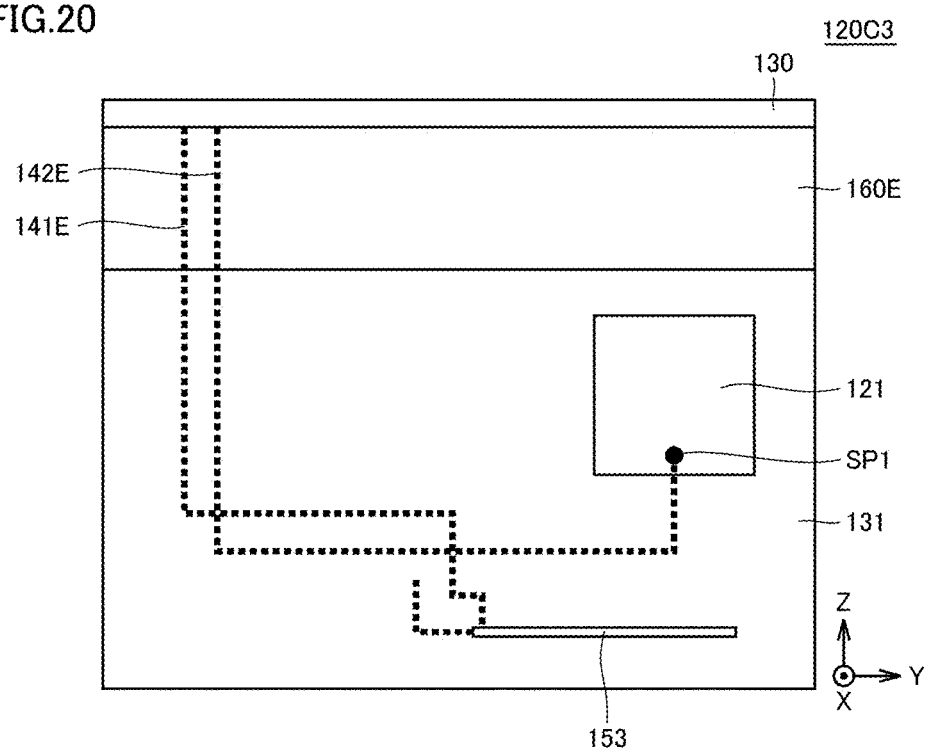
FIG. 20 is a diagram (part 6) of the antenna device viewed from the positive direction of the X-axis.

FIG. 20 is a diagram illustrating an antenna device 120C3 according to another example of Modification 7-3 when the antenna device 120C3 is viewed from the positive direction of the X-axis. The antenna device 120C3 is different from the above-described antenna device 120C2 illustrated in FIG. 19 in that the feeding element 124 is changed to an inverted F-type antenna 153 that, radiates a radio wave of 6 GHz, for example, and the feeding element 125 is changed to the feeding element 121 that, radiates a radio wave of 24 GHz, for example.

In the antenna device 120C3, the second line 142E disposed at the inner side in the bent portion of the flexible substrate 160E is connected to the inverted F-type antenna 153 that radiates a radio wave of a lower frequency (for example, 6 GHz), and the second line 142E disposed at the outer side in the bent portion is connected to the feeding element 121 that radiates a radio wave of a higher frequency (for example, 24 GHz).

In any of the antenna devices 120C3 to 120C3, the ground electrode GND is disposed between the first line 141E and the second line 142E of the flexible substrate 160E. Thus, isolation between different frequencies can be easily ensured.

<Modification 7-4>

When three or more lines are provided in the flexible substrate 160, the lines may be arranged as follows.

Figure 21:
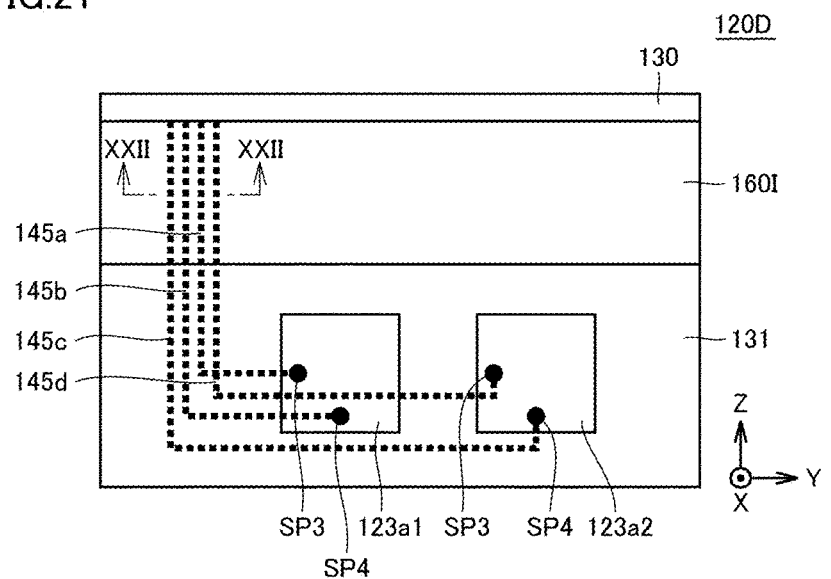
FIG. 21 is a diagram (part 7) of the antenna device viewed from the positive direction of the X-axis.

FIG. 21 is a diagram illustrating an antenna device 120D according to an example of Modification 7-4 when the antenna device 120D is viewed from the positive direction of the X-axis. The antenna device 120D is different from the above-described antenna device 120 in that the feeding elements 121a1 and 121a2 of the single-polarization type are changed to feeding elements 123a1 and 123a2 of the dual-polarization type, respectively, and the flexible substrate 160 is changed to a flexible substrate 160I.

The feeding elements 123a1 and 123a2 are obtained by aligning the feeding elements 123 illustrated in FIG. 17 described above at a predetermined interval in the Y-axis direction. Thus, each of the feeding elements 123a1 and 123a2 includes the feeding point SP3 for a Y-polarized wave and the feeding point SP4 for a Z-polarized wave.

The flexible substrate 160I includes a first line 145a, a second line 145b, a third line 145c, and a fourth line 145d.

The first line 145a is connected to the feeding point SP3 for a Y-polarized wave of the feeding element 123a1. The second line 145b is connected to the feeding point SP4 for a Z-polarized wave of the feeding element 123a1. The third line 145c is connected to the feeding point SF4 for a Z-polarized wave of the feeding element 123a2. The fourth line 145d is connected to the feeding point SP3 for a Y-polarized wave of the feeding element 123a2.

Figure 22:
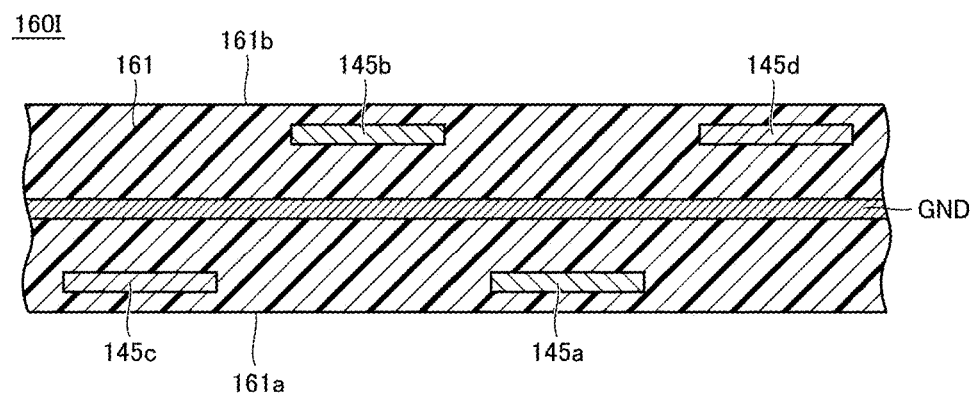
FIG. 22 is a partial cross-sectional view (part 9) of the flexible substrate.

FIG. 22 is a partial cross-sectional view taken along the line XXXI-XXII in FIG. 21 of the flexible substrate 160I. As illustrated in FIG. 22, both of the first line 145a and the third line 145c are provided in the same layer, that is, in a layer at the first surface 161a side (at the lower side in FIG. 22) from the ground electrode GND. Both of the second line 145b and the fourth line 145d are provided in the same layer, that is, in a layer at the second surface 161b side (at the upper side in FIG. 22) from the ground electrode GND. Note that the feeding element 123a1, the feeding point SP3 of the feeding element 123a1, and the feeding point SF4 of the feeding element 123a1 may correspond to a "first element", a "first feeding point of the first element", and a "second feeding point of the first element" of the present disclosure, respectively. Further, the feeding element 123a2, the feeding point SP3 of the feeding element 123a2, and the feeding point SP4 of the feeding element 123a2 may correspond to a "second element", a "first feeding point of the second element", and a "second feeding point of the second element" of the present disclosure, respectively. Further, the first line 145a, the second line 145b, the third line 145c, and the fourth line 145d may correspond to a "first line", a "second line", a "third line", and a "fourth line" of the present disclosure, respectively.

With such arrangement, isolation between the Y-polarized wave and the Z-polarized wave of the feeding element 123a1 (isolation between the first line 145a and the second line 145b) and isolation between the Y-polarized wave and the Z-polarized wave of the feeding element 123a2 (isolation between the third line 145c and the fourth line 145d) can be ensured. Furthermore, isolation between the Y-polarized waves of the feeding elements 123a1 and 123a2 adjacent to each other (isolation between the first line 145a and the fourth line 145d) and isolation between the Z-polarized waves of the feeding elements 123a1 and 123a2 adjacent to each other (isolation between the second line 145b and the third line 145c) can also be ensured.

Figure 23:
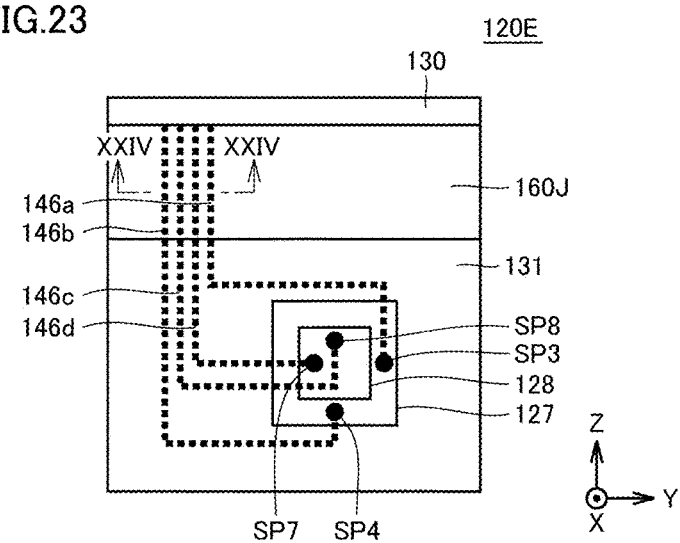
FIG. 23 is a diagram (part 8) of the antenna device viewed from the positive direction of the X-axis.

FIG. 23 is a diagram illustrating an antenna device 120E according to another example of Modification 7-4 when the antenna device 120E is viewed from the positive direction of the X-axis. The antenna, device 120E is different from the above-described antenna device 120C1 illustrated in FIG. 18 in that the feeding elements 124 and 125 of the single-polarization type are changed to the feeding elements 127 and 128 of the dual-polarization type and the flexible substrate 160E is changed to a flexible substrate 160J.

The feeding element 127 and the feeding element 128 are disposed at positions overlapping each other when viewed from the X-axis direction, at a predetermined interval in the X-axis direction. The feeding element 127 includes the feeding point SP3 for a Y-polarized wave and the feeding point SP4 for a Z-polarized wave. The feeding element 128 includes a feeding point SP7 for a Y-polarized wave and a feeding point SP8 for a Z-polarized wave.

The flexible substrate 160J includes a first line 146a, a second line 146b, a third line 146c, and a fourth line 146d. The first line 146a is connected to the feeding point SP3 for a Y-polarized wave of the feeding element 127. The second line 146b is connected to the feeding point SP4 for a Z-polarized wave ox the feeding element 127. The third line 146c is connected to the feeding point SP8 for a Z-polarized wave of the feeding element 128. The fourth line 146d is connected to the feeding point SP7 for a Y-polarized wave of the feeding element 128.

Figure 24:
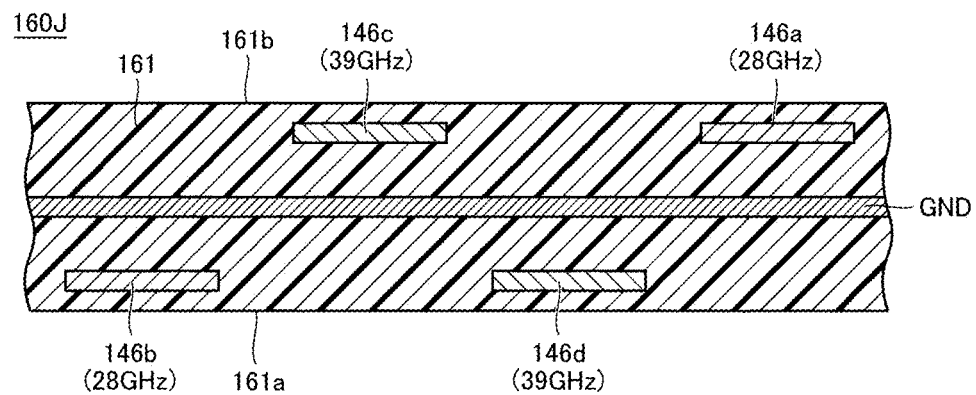
FIG. 24 is a partial cross-sectional view (part 10) of the flexible substrate.

FIG. 24 is a partial cross-sectional view taken along the line XXIV-XXIV in FIG. 23 of the flexible substrate 160J. As illustrated in FIG. 24, both of the first line 146a and the third line 146c are provided in the same layer, that is, in a layer at the second surface 161b side (at the upper side in FIG. 24) from the ground electrode GND. Both of the second line 146b and the fourth line 146d are provided in the same layer, that is, in a layer at the first surface 161a side (at the lower side in FIG. 24) from the ground electrode GND. Note that the feeding element 127, the feeding point SP3 of the feeding element 127, and the feeding point SP4 of the feeding element 127 may correspond to a "first element", a "first feeding point of the first element", and a "second feeding point of the first element" of the present disclosure, respectively. Further, the feeding element 128, the feeding point SP7 of the feeding element 128, and the feeding point SP8 of the feeding element 128 may correspond to a "second element", a "first feeding point of the second element", and a "second feeding point of the second element" of the present disclosure, respectively. Further, the first line 146a, the second line 146b, the third line 146c, and the fourth line 146d may correspond to a "first line", a "second line", a "third line", and a "fourth line" of the present disclosure, respectively.

With such arrangement, isolation between the Y-polarized wave and the Z-polarized wave of the feeding element 127 (isolation between the first line 146a and the second line 146b) and isolation between the Y-polarized wave and the Z-polarized wave of the feeding element 123 (isolation between the third line 146c and the fourth line 146d) can be ensured. Furthermore, isolation between Y-polarized waves of the feeding elements 127 and 123 (isolation between the first line 146a and the fourth line 146d) and isolation between Z-polarized waves of the feeding elements 127 and 123 (isolation between the second line 146b and the third line 146c) can also be ensured.

Figure 25:
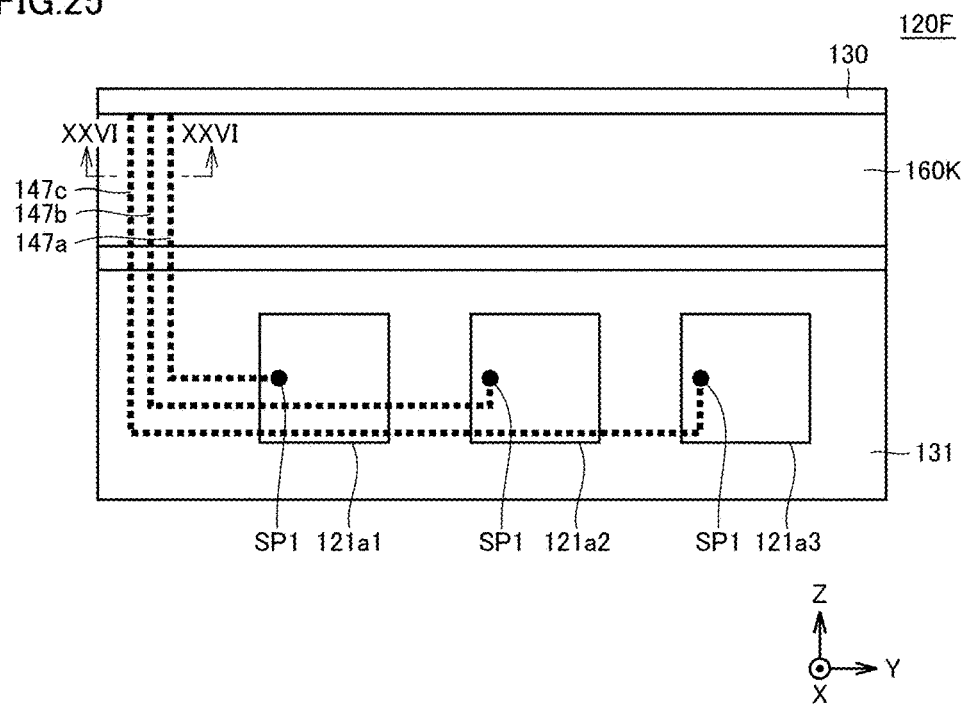
FIG. 25 is a diagram (part 9) of the antenna device viewed from the positive direction of the X-axis.

FIG. 25 is a diagram illustrating an antenna device 120F according to another example of Modification 7-4 when the antenna device 120F is viewed from the positive direction of the X-axis. The antenna device 120F is different from the antenna device 120 described above in that a single-polarization type feeding element 121a3 is added at the positive direction, side of the Y-axis of the feeding element 121a2 and the flexible substrate 160 is changed to a flexible substrate 160K.

The flexible substrate 160K includes a first line 147a, a second line 147b, and a third line 147c. The first line 147a is connected to the feeding point SP1 of the feeding element 121a1. The second line 147b is connected to the feeding point SP1 of the feeding element 121a2. The third line 147c is connected to the feeding point SP1 of the feeding element 121a3.

Figure 26:
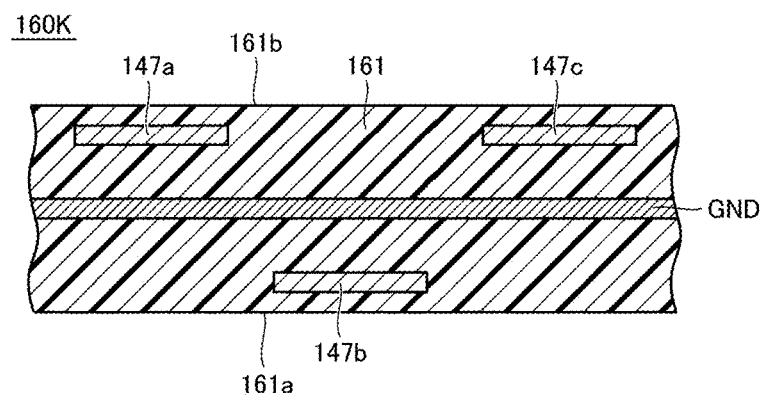
FIG. 26 is a partial cross-sectional view (part 11) of the flexible substrate.

FIG. 26 is a partial cross-sectional view taken along the line XXVI-XXVI in FIG. 25 of the flexible substrate 160K. As illustrated in FIG. 26, both of the first line 147a and the third line 147c are provided in the same layer, that is, in a layer at the second surface 161b side (at the upper side in FIG. 26) from the ground electrode GND. The second line 147b is provided in a layer at the first surface 161a side (at the lower side in FIG. 26) from the ground electrode GND.

With such arrangement, it is possible to ensure isolation between the feeding elements adjacent to each other (isolation between the first line 147a and the second line 147b and isolation between the second line 147b and the third line 146c).

<Modification 8>

The antenna module 100 according to the above-described embodiment includes the flexible substrate 160 and the feeding elements 121a (121a1 and 121a2). However, the feeding element is not necessarily disposed, inside the antenna module, and the feeding element may be disposed outside the antenna module.

Figure 27:
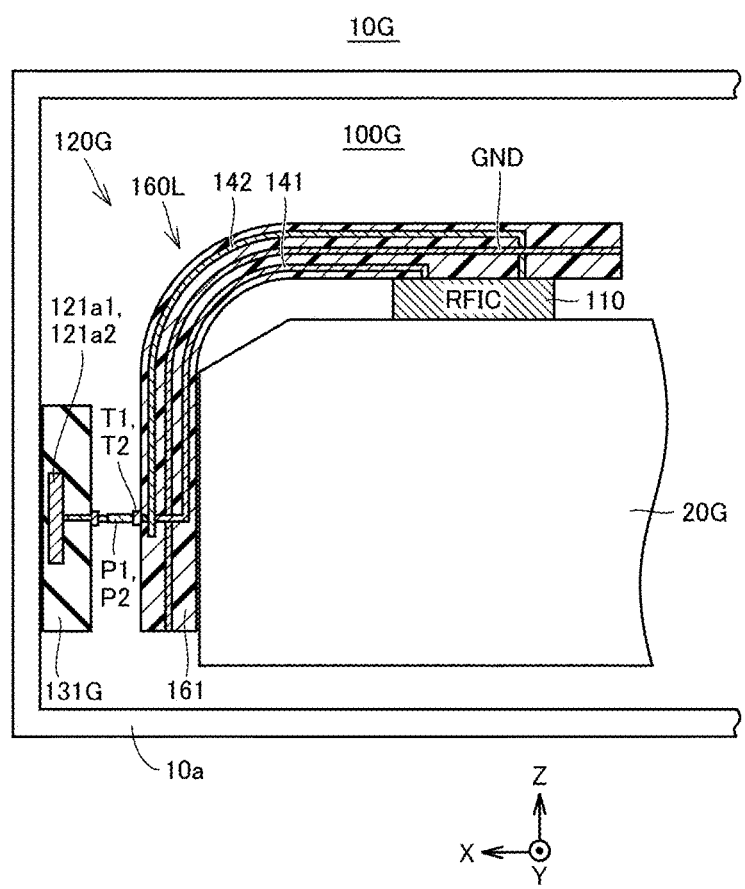
FIG. 27 is a cross-sectional view (part 2) of the antenna device viewed from the positive direction of the Y-axis.

FIG. 27 is a cross-sectional view of a communication device 10G including an antenna module 100G according to Modification 8 when the communication device 100G is viewed from the positive direction of the Y-axis. The communication device 10G includes the antenna module 100G and a dielectric substrate 131G. The antenna module 100G includes the RFIC 110 and a flexible substrate 160L.

The flexible substrate 160L is different from the flexible substrate 160 according to the above-described embodiment in that the dielectric substrates 130 and 131 are removed and the output terminals T1 and T2 are added. The output terminal T1 is connected to an end portion of the first line 141. The output terminal T2 is connected to an end portion of the second line 142.

The feeding elements 121a1 and 121a2 are disposed in the dielectric substrate 131G. The dielectric substrate 131G is disposed on a side wall of a housing 10a covering the entire communication device 10G. The feeding elements 121a1 and 121a2 are connected to the output terminals T1 and T2 of the antenna module 100G by using pogo pins P1 and P2, respectively.

That is, in Modification 8, the feeding elements 121a1 and 121a2 are disposed outside the antenna module 100G. Then, the antenna module 100G is provided with the output terminals T1 and T2 for connection to the external feeding elements 121a1 and 121a2. The output terminals T1 and 72 are connected to the feeding elements 121a1 and 121a2 by using the pogo pins P1 and P2, respectively.

As described above, the feeding elements 121a1 and 121a2 may be arranged outside the antenna module 100G in the housing 10a, and the output terminals T1 and T2 of the antenna module 100G may be connected to the feeding elements 121a1 and 121a2 of the housing 10a by using, for example, the pogo pins P1 and P2. Note that the output terminals T1 and T2 may correspond to a "first terminal" and a "second terminal" of the present disclosure, respectively.

Note that although FIG. 27 described above illustrates an example in which the feeding elements 121a1 and 121a2 are provided in the dielectric substrate 131G disposed on the side wall of the housing 10a, part or all of the side wall of the housing 10a may be formed of a dielectric, and the feeding elements 121a1 and 121a2 may be embedded in the side wall of the housing 10a.

Additionally, Modification 8 can also be applied to the antenna devices illustrated in FIG. 16 to FIG. 21, FIG. 23, and FIG. 25 described above. For example, in the antenna device 120l) including the first to fourth lines 145a to 145d as illustrated in FIG. 21 described above, the feeding elements 123a1 and 123a2 may be disposed outside the antenna module, first to fourth output terminals respectively connected to the end portions of the first to fourth lines 145a to 145d may be provided, and the first to fourth output terminals may be individually connected to the feeding points SP3 and SP4 of the feeding elements 123a1 and 123a2 by using four pogo pins, for example.

<Modification 9>

In the above-described embodiment, the example in which the flexible substrate 160 is used for connection between the RFIC 110 and the feeding elements 121 has been described. However, the usage of the flexible substrate 160 is not limited to the connection between the RFIC 110 end the feeding elements 121. For example, the flexible substrate 160 may be used to connect the RFIC 110 and the BBIC 200.

Further, the flexible substrate 160 may be applied to an item other than the antenna module. For example, when the flexible substrate 160 is applied to a camera including an image-capturing element and a motherboard, the flexible substrate 160 may be applied for connection between the image-capturing element and the motherboard.

<Modification 10>

In the above-described embodiment, the flexible substrate 160 is mounted on the antenna module and is shown in a bent state. However, even the flexible substrate 160 in a state of a single item (a state of not being bent) before being mounted in the antenna module corresponds to a "flexible substrate" of the present disclosure.

The embodiments disclosed herein are to be considered in all respects as illustrative and not restrictive. The scope of the present disclosure is defined not by the description of the above-described embodiments but by the claims, and is intended to include all modifications within the meaning and scope equivalent to the claims.

REFERENCE SIGNS LIST 10, 10G COMMUNICATION device
10a HOUSING
20 MOUNTING SUBSTRATE
21 MAIN SURFACE
22 SIDE SURFACE
100, 100G ANTENNA MODULE
111A to 113D, 117 SWITCH
112AR to 112DR LOW-NOISE AMPLIFIER
112AT to 112DT POWER AMPLIFIER
114A to 114D ATTENUATOR
115A to 115D PHASE SHIFTER
116 SIGNAL MULTIPLEXER/DEMULTIPLEXER
116 MIXER
119 AMPLIFIER CIRCUIT
120, 120A, 120E, 120C1, 120C2, 120C3, 120D, 120E, 120F ANTENNA DEVICE
121, 121a, 121a1, 121a2, 121a3, 121b, 123, 123a1, 123a2, 124, 125, 127, 128 FEEDING ELEMENT
130, 131, 131G DIELECTRIC SUBSTRATE
141, 141A, 141E, 141F1, 141F2, 141G, 141H, 145a, 146a, 147a FIRST LINE
142, 142A, 142E, 142F1, 142F2, 142G, 142H, 145b, 146b, 147b SECOND LINE
145c, 146c, 147c THIRD LINE
145d, 146d FOURTH LINE
141a, 141Aa, 142a, 142Aa LINE-SYMMETRICAL PORTION
141Ab, 142-Ab PARALLEL PORTION
141Ac, 142Ac INCLINED PORTION
151, 152 DIPOLE ANTENNA
153 ANTENNA
160, 160A, 160B, 160C2, 160C1, 160D, 160E, 160F1, 160F2, 160G, 160H, 160I, 160J, 160K, 160L FLEXIBLE SUBSTRATE
161 DIELECTRIC
161a FIRST SURFACE
161b SECOND SURFACE
162 VIA
GND, GND1, GND2, GND3, GND4, GND5, GND6 GROUND ELECTRODE
P1, P2 POGO PIN
T1, T2 OUTPUT TERMINAL

The invention claimed is:

1. A flexible substrate having a plate shape, comprising:
a first surface;
a second surface opposed to the first surface; and
a first line provided on the first surface or in a layer between the first surface and the second surface;
a second line provided on the second surface or in a layer between the second surface and the first line; and
a ground electrode provided in a layer between the first line and the second line so as to extend in the layer between the first surface and the second surface,
wherein the ground electrode forms a first radio frequency transmission line together with the first line and forms a second radio frequency transmission line together with the second line, and
under a condition the flexible substrate is seen through from a thickness direction of the flexible substrate, the first line has a line-symmetrical portion that is line-symmetrical with respect to the second line with a virtual intermediate line between the first line and the second line serving as a symmetric line,
wherein the first line and the second line have portions intersecting each other under a condition the flexible substrate is seen through from the thickness direction of the flexible substrate, and
wherein the ground electrode includes
a first ground electrode and a second ground electrode that are aligned and arranged in the thickness direction of the flexible substrate, and
a via that electrically connects the first ground electrode to the second ground electrode.

2. The flexible substrate according to claim 1,
wherein the line-symmetrical portion of the first line has a portion parallel to the second line under a condition the flexible substrate is seen through from the thickness direction of the flexible substrate.

3. The flexible substrate according to claim 1,
wherein the first line is provided in the layer between the first surface and the second surface, and the flexible substrate further includes
a third ground electrode that is also provided in the layer between the first surface and the second surface, or
a fourth ground electrode provided in the layer between the second surface and the first line.

4. The flexible substrate according to claim 1,
wherein the first line is provided in a layer between the first surface and the ground electrode, and
the second line is provided in a layer between the second surface and the ground electrode, and
the flexible substrate further includes at least one of
a fifth ground electrode provided in a layer positioned at a first surface side with respect to the first line, and
a sixth ground electrode provided in a layer positioned at a second surface side with respect to the second line.

5. The flexible substrate according to claim 4,
wherein in a state in which the flexible substrate includes a portion that includes a bend with the first surface facing an inner side of the bend,
the first line is configured to convey a signal having a first frequency, and the second line is configured to convey a signal having a second frequency higher than the first frequency.

6. The flexible substrate according to claim 5,
wherein a distance between one line of the first line and the second line and the ground electrode is shorter than a distance between another line and the ground electrode, the another line being the other of the first line and the second line, and
a width of the one line is smaller than a width of the another line.

7. An antenna module comprising:
a flexible substrate having a plate shape; and
a feeding element connected to the first line and the second line of the flexible substrate,
wherein the flexible substrate having the plate shape comprises:
  a first surface;
  a second surface opposed to the first surface; and
  a first line provided on the first surface or in a layer between the first surface and the second surface;
  a second line provided on the second surface or in a layer between the second surface and the first line; and
  a ground electrode provided in a layer between the first line and the second line so as to extend in the layer between the first surface and the second surface,
wherein the around electrode forms a first radio frequency transmission line together with the first line and forms a second radio frequency transmission line together with the second line, and
under a condition the flexible substrate is seen through from a thickness direction of the flexible substrate, the first line has a line-symmetrical portion that is line-symmetrical with respect to the second line with a virtual intermediate line between the first line and the second line serving as a symmetric line.

8. The antenna module according to claim 7,
wherein the feeding element includes a first element and a second element,
the first line is connected to the first element, and
the second line is connected to the second element.

9. The antenna module according to claim 7,
wherein the feeding element has a flat plate shape, and
the feeding element includes
a first feeding point that in response to being fed with RF power radiates a radio wave having a polarization direction in a first direction, and
a second feeding point that in response to being fed with RF power radiates a radio wave having a polarization direction in a second direction different from the first direction,
the first line is connected to the first feeding point, and
the second line is connected to the second feeding point.

10. The antenna module according to claim 7,
wherein the feeding element includes
a first element configured to radiate a radio wave,
a second element configured to radiate a radio wave having a frequency different from a frequency of a radio wave radiated by the first element,
the first line is connected to the first element, and
the second line is connected to the second element.

11. The antenna module according to claim 7,
wherein the feeding element includes a first element and a second element,
each of the first element and the second element includes
a first feeding point that in response to being fed with RF power radiates a radio wave having a polarization direction in a first direction, and
a second feeding point that in response to being fed with RF power radiates a radio wave having a polarization direction in a second direction different from the first direction,
the flexible substrate further includes
a third line provided in the layer between the first surface and the second surface, and
a fourth line provided in the layer between the second surface and the first line,
the first line, the second line, the third line, and the fourth line have portions that do not overlap each other when the flexible substrate is seen through from the thickness direction of the flexible substrate,
the first line is connected to a first feeding point of the first element,
the second line is connected to a second feeding point of the first element,
the third line is connected to a second feeding point of the second element, and
the fourth line is connected to a first feeding point of the second element.

12. The antenna module according to claim 11,
wherein the second element is aligned and arranged with respect to the first element at a predetermined interval.

13. The antenna module according to claim 11,
wherein the second element is configured to radiate a radio wave having a frequency different from a frequency of a radio wave radiated 1$w$ the first element.

14. The antenna module according to claim 7,
wherein the feeding element includes a plurality of elements aligned and arranged at predetermined intervals,
the flexible substrate includes three or more lines that include the first line and the second line, and
two lines, of the three or more lines, are individually connected to two of the plurality of elements adjacent to each other and are disposed at different sides from each other with the ground electrode being sandwiched between the two lines.

15. An antenna module comprising:
a flexible substrate having a plate shape; and
an output terminal connected to the first line and the second line of the flexible substrate and configured to output a signal to an external feeding element,
wherein the flexible substrate having the plate shape comprises:
  a first surface;
  a second surface opposed to the first surface; and
  a first line provided on the first surface or in a layer between the first surface and the second surface;
  a second line provided on the second surface or in a layer between the second surface and the first line; and
  a ground electrode provided in a layer between the first line and the second line so as to extend in the layer between the first surface and the second surface,
wherein the ground electrode forms a first radio frequency transmission line together with the first line and forms a second radio frequency transmission line together with the second line, and
under a condition the flexible substrate is seen through from a thickness direction of the flexible substrate, the first line has a line-symmetrical portion that is line-symmetrical with respect to the second line with a virtual intermediate line between the first line and the second line serving as a symmetric line.

16. The antenna module according to claim 15, wherein the output terminal includes
a first terminal connected to the first line, and
a second terminal connected to the second line,
the external feeding element includes a first element and a second element,
the first terminal is connected to the first element, and
the second terminal is connected to the second element.

17. The antenna module according to claim 15, wherein the output terminal includes
a first terminal connected to the first line, and
a second terminal connected to the second line,
the external feeding element includes
a first element configured to radiate a radio wave, and
a second element configured to radiate a radio wave having a frequency different from a frequency of a radio wave radiated by the first element,
the first terminal is connected to the first element, and
the second terminal is connected to the second element.

18. The antenna module according to claim 15, wherein the external feeding element includes a first element and a second element,
each of the first element and the second element includes
a first feeding point that in response to being fed with RF power radiates a radio wave having a polarization direction in a first direction, and
a second feeding point that in response to being fed with RF power radiates a radio wave having a polarization direction in a second direction different from the first direction,
the flexible substrate further includes
a third line provided in the same layer as the first line, and
a fourth line provided in the same layer as the second line,
the first line, the second line, the third line, and the fourth line have portions that do not overlap each other under a condition the flexible substrate is seen through from the thickness direction of the flexible substrate,
the output terminal includes
a first terminal connected to the first line,
a second terminal connected to the second line,
a third terminal connected to the third line, and
a fourth terminal connected to the fourth line,
the first terminal is connected to a first feeding point of the first element,
the second terminal is connected to a second feeding point of the first element,
the third terminal is connected to a second feeding point of the second element, and
the fourth terminal is connected to a first feeding point of the second element.

* * * * *